(12) United States Patent
Koarai (10) Patent No.: US 9,162,879 B2
(45) Date of Patent: Oct. 20, 2015

(54) ELECTRONIC DEVICE

(75) Inventor: Mitsuru Koarai, Yamanashi (JP)

(73) Assignees: PIONEER CORPORATION, Kanagawa (JP); PIONEER MICRO TECHNOLOGY CORPORATION, Yamanashi (JP)

(*) Notice: Subject to any disclaimer, the term of this patent is extended or adjusted under 35 U.S.C. 154(b) by 0 days.

(21) Appl. No.: 14/418,986

(22) PCT Filed: Aug. 1, 2012

(86) PCT No.: PCT/JP2012/004894
§ 371 (c)(1),
(2), (4) Date: Mar. 9, 2015

(87) PCT Pub. No.: WO2014/020648
PCT Pub. Date: Feb. 6, 2014

(65) Prior Publication Data
US 2015/0239734 A1      Aug. 27, 2015

(51) Int. Cl.
*H01L 29/40*      (2006.01)
*B81C 1/00*       (2006.01)
*B81B 7/00*       (2006.01)

(52) U.S. Cl.
CPC ........... *B81C 1/00269* (2013.01); *B81B 7/008* (2013.01)

(58) Field of Classification Search
None
See application file for complete search history.

(56) References Cited

U.S. PATENT DOCUMENTS

| 8,896,132 B2 | 11/2014 | Noda et al. |
| 2007/0164444 A1* | 7/2007 | Sekido et al. ............. 257/777 |
| 2013/0207277 A1 | 8/2013 | Noda et al. |

FOREIGN PATENT DOCUMENTS

| JP | 2009-038286 | 2/2009 |
| JP | 4913928 | 4/2012 |

OTHER PUBLICATIONS

International Search Report PCT/JP2012/004894 dated Oct. 2, 2012.

* cited by examiner

*Primary Examiner* — Jack Chen
(74) *Attorney, Agent, or Firm* — Young & Thompson (57) ABSTRACT

An electronic device is obtained in such a way that a MEMS substrate having a MEMS element mounted thereon and a CMOS substrate are bonded together at bonding surfaces and with a bonding material M having fluidity, wherein the MEMS substrate has a bonding projection part provided to project from a substrate main body and having the bonding surface and a gap formation part disposed between the bonding projection part and the MEMS element, and the gap formation part is supported by the bonding projection part via a plurality of support pieces extending from the bonding projection part and forms reception gaps, which are capable of receiving the bonding material M extruded from the bonding surface to the side of the MEMS element, between the wall surface thereof and the bonding projection part.

5 Claims, 7 Drawing Sheets

ELECTRONIC DEVICE

TECHNICAL FIELD

The present invention relates to an electronic device obtained in such a way that a second substrate is bonded to a first substrate on which a functional element such as a semiconductor element and a MEMS element is mounted.

BACKGROUND ART

As such, a known electronic device is one in which a MEMS substrate having a MEMS structure, a CMOS substrate having an integrated circuit that controls the MEMS structure, and a bonding section that bonds the MEMS substrate and the CMOS substrate together and seals the same are provided and in which the two substrates are bonded together to be packaged (see Patent Document 1). The bonding section is constituted of a bonding projection part provided to project from the MEMS substrate and a eutectic alloy deposited on the bonding projection part. Further, the MEMS substrate and the CMOS substrate are bonded together in such a way that the bonding surface of the bonding projection part and the bonding surface of the CMOS substrate are eutectically bonded together with the eutectic alloy.

[Patent Document 1] Japanese Patent No. 481328

DISCLOSURE OF THE INVENTION

Problems that the Invention is to Solve

Meanwhile, the above configuration may cause a case in which the melted and fluidized eutectic alloy is extruded from between the bonding surfaces when both the substrates are bonded together. Particularly, in a case in which a certain error occurs in the approximate distance between the bonding surfaces, it is required to arrange a rather larger amount of the eutectic alloy so as to tolerate the error. Consequently, there is the case that a surplus of the eutectic alloy is extruded from between the bonding surfaces. Then, when being extruded from between the bonding surfaces, the eutectic alloy contacts (adheres to) the mounted MEMS structure and the peripheral circuits thereof, which causes the problem that the MEMS structure fails.

Accordingly, in the above conventional configuration, it is required to arrange the MEMS structure and the peripheral circuits thereof so as to be substantially away from the bonding surfaces in consideration of the extrusion of the eutectic alloy. That is, the configuration gives rise to the problem that the arrangement areas of the MEMS structure and the peripheral circuits are limited and thus cannot be enlarged or the electronic device is upsized.

The present invention has an object of providing an electronic device capable of preventing a bonding material from contacting a functional element and the peripheral circuits thereof without narrowing the arrangement areas of the functional element and the peripheral circuits thereof.

Means for Solving the Problems

The present invention provides an electronic device obtained in such a way that a first substrate having a functional element mounted thereon and a second substrate are bonded together at bonding surfaces thereof with a bonding material having fluidity, wherein at least one of the first substrate and the second substrate has a bonding projection part provided to project from a substrate main body to an opposite surface side thereof and having the bonding surface and a wall body disposed between the bonding projection part and the functional element, and the wall body is supported by the bonding projection part via support pieces extending from the bonding projection part and forms reception gaps, which are capable of receiving the bonding material extruded from the bonding surface to a side of the functional element, between a wall surface thereof and the bonding projection part.

According to the configuration, the reception gaps (reception space) are formed between the wall body and the bonding projection part, whereby the bonding material extruded from the bonding surface is flowed into and received by the reception gaps. Accordingly, the bonding material is prevented from being flowed into the side of the functional element. Therefore, the bonding material can be prevented from contacting the functional element and the peripheral circuits thereof without narrowing the arrangement areas of the functional element and the peripheral circuits thereof. In other words, the arrangement areas of the functional element and the peripheral circuits thereof can be enlarged. In addition, since the wall body is supported by the bonding projection part, the wall body is not required to stand up for itself and not required to have a thickness (rigidity) to stand up for itself. That is, since the wall body can be made thin to a greater extent, the arrangement areas of the functional element and the peripheral circuits thereof can be further enlarged. Note that the above "bonding material" is a concept representing a broad adhesive including a eutectic alloy. In addition, the above "gaps" are concepts representing only air or a vacuum existing between both the members, i.e., air gaps. Moreover, the above "functional element" is a concept including a MEMS element and a semiconductor element.

In this case, the wall body is preferably separated from the substrate main body at least at a part thereof.

According to the configuration, since an air hole is made at a part at which the wall body is separated from the substrate main body, internal atmosphere is released from the separated part when the bonding material is flowed. Consequently, the bonding material can be effectively (smoothly) flowed into the reception gaps.

In this case, the reception gaps are preferably formed to have a width by which a capillary phenomenon occurs in the bonding material.

According to the configuration, since the capillary phenomenon occurs at the reception gaps, the bonding material is smoothly flowed into (absorbed by) the reception gaps and remains there. Furthermore, the bonding material can be absorbed by the reception gaps regardless of how the first substrate and the second substrate are placed at the bonding. Thus, the bonding material extruded from the bonding surface can be efficiently received and reliably prevented from contacting the functional element and the peripheral circuits thereof.

In this case, the bonding projection part is preferably formed in a flat square so as to surround the functional element, and the reception gap corresponding to at least one corner part of the bonding projection part is preferably formed to have a wider width than the reception gaps at the other parts thereof.

If the reception gaps are simply formed in a flat square with respect to the bonding projection part formed in a flat square, the bonding material is likely to gather at the corner parts (corners) and excessively remains there. Therefore, there is the case that the bonding material is not received at the corner parts.

Against this, according to the above configuration, the reception gaps at the corner parts are formed to have a wider width than the reception gaps at the other parts. Consequently, the bonding material can be suitably received at the corner parts as well.

In this case, the bonding material is preferably a eutectic alloy.

According to the configuration, the first substrate and the second substrate can be bonded together in a sealed state (vacuum-sealed) by eutectic bonding using the eutectic alloy. In addition, if the eutectic alloy contains aluminum as one constituent thereof, bonding of both the substrates and the circuit connection between both the substrates can be simultaneously performed, which enables the manufacturing of the electronic device to be made easier.

In this case, the second substrate preferably has mounted thereon an integrated circuit that controls the functional element.

According to the configuration, since the bonding material is prevented from being flowed into the side of the functional element, not only the arrangement areas of the functional element and the peripheral circuits thereof in the first substrate but the arrangement area of the integrated circuit in the second substrate can be enlarged in the electronic device in which the functional element and the integrated circuit are disposed on both the substrates.

DESCRIPTION OF EXEMPLARY EMBODIMENTS

Hereinafter, with reference to the accompanying drawings, a description will be given of an electronic device according to an embodiment of the present invention. The electronic device is a MEMS device including a MEMS (Micro Electro Mechanical System) element, i.e., a MEMS package in which two substrates are bonded together. The electronic device has a bonding structure in which a bonding material fluidized and extruded from between bonding surfaces can be suitably prevented from contacting the MEMS element and the peripheral circuit thereof.

Figure 1A:
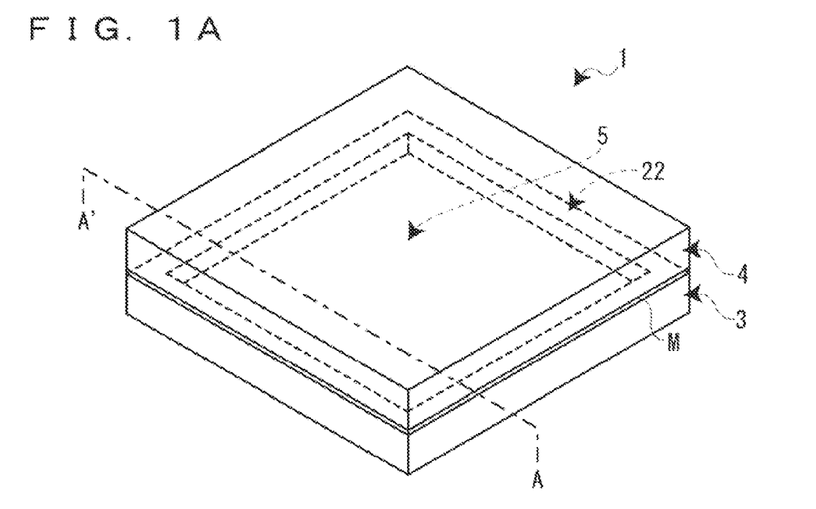
FIG. 1A is an external perspective view schematically showing an electronic device according to an embodiment of the present invention.
Figure 1B:
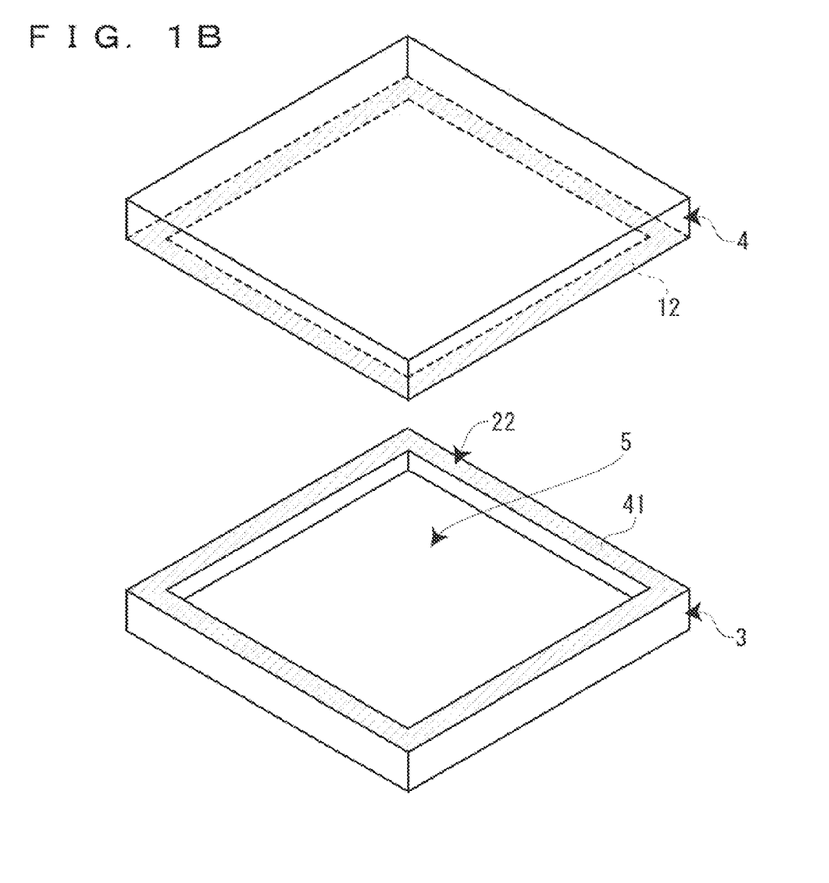
FIG. 1B is a perspective view schematically showing a MEMS substrate and a CMOS substrate that are to be bonded together.
Figure 2:
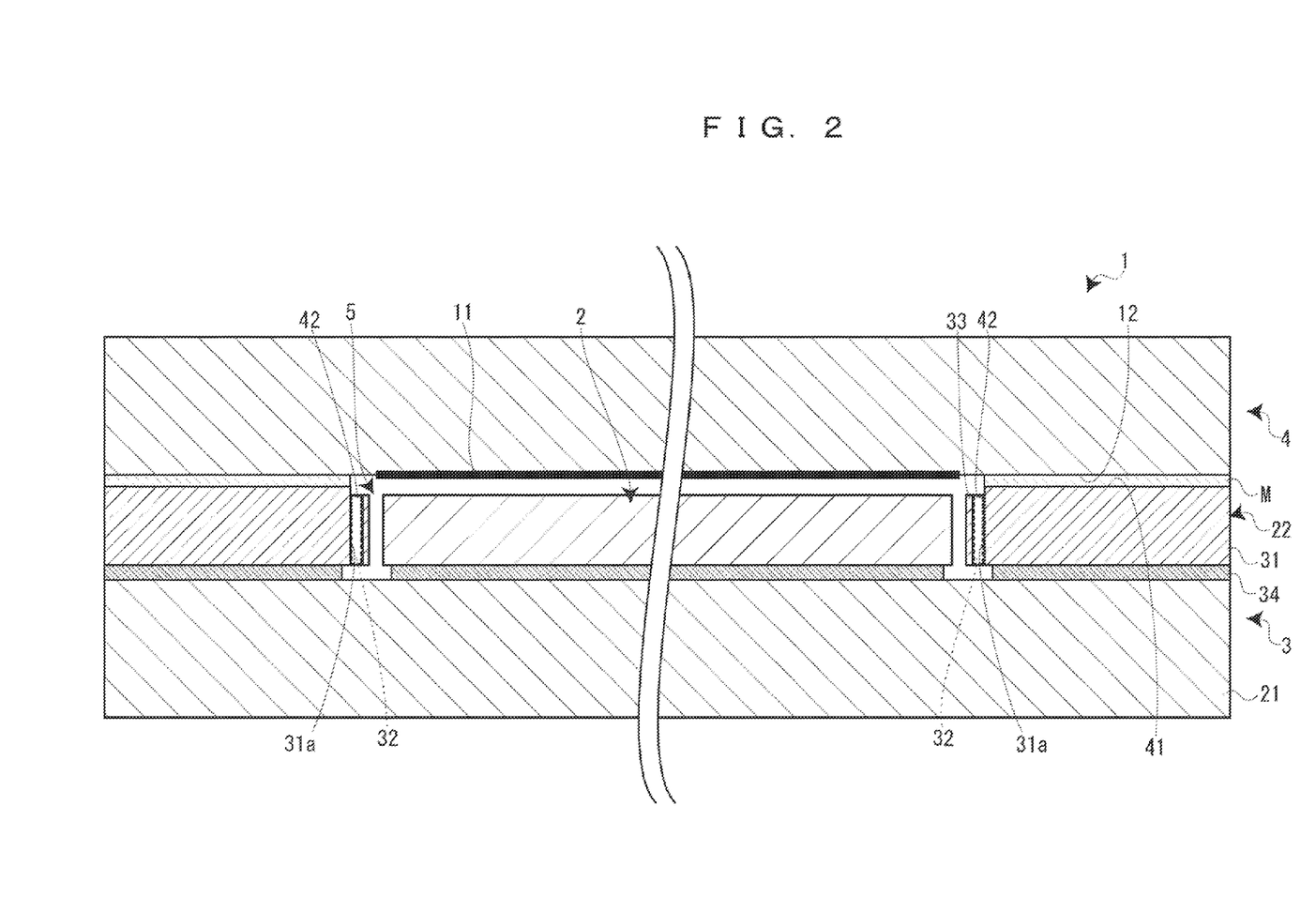
FIG. 2 is a cross-sectional view taken along the line A-A' shown in FIG. 1A.

As shown in FIGS. 1A and 1B and FIG. 2, an electronic device 1 has a MEMS substrate (first substrate) 3 on which a MEMS element (functional element) 2 is mounted and a CMOS (Complementary Metal Oxide Semiconductor) substrate (second substrate) 4 on which an integrated circuit 11 that controls the MEMS element 2 is mounted. That is, the electronic device 1 is obtained in such a way that the MEMS substrate 3 and the CMOS substrate 4 facing each other are bonded together at the bonding surfaces thereof with a bonding material M. The MEMS substrate 3 has a hollow section 5 that accommodates the MEMS element 2, and the CMOS substrate 4 functions as a cover body that seals and closes the hollow section 5 to cover the MEMS element 2. Note that the MEMS element 2 is, for example, an acceleration sensor element, an angular speed sensor element, an infrared sensor element, a magnetic sensor element, an acoustic sensor element, or the like. Further, the MEMS element 2 and the integrated circuit 11 are not shown in FIG. 1.

The bonding material M is made of a eutectic alloy.

Specifically, the bonding material M is made of an aluminum-germanium alloy obtained by subjecting aluminum and germanium to a eutectic reaction. The bonding material M plays a role in not only bonding both the substrates 3 and 4 together but sealing both the substrates 3 and 4 together and bringing the same into conduction. In addition, the bonding material M is formed in such a way that a deposited aluminum-containing layer and a germanium layer are heated and pressed to be brought into a eutectic reaction between the bonding surfaces 12 and 41 of both the substrates 3 and 4.

The CMOS substrate 4 is a silicon substrate made of silicon (Si), and the integrated circuit 11 is formed on the CMOS substrate 4 according to a semiconductor manufacturing technology. The integrated circuit 11 is electrically connected to the MEMS element 2 of the MEMS substrate 3 to control the same, and an input/output signal line is connected to the integrated circuit 11 from an outside (not shown). In the CMOS substrate 4, a region facing a bonding projection part 31 of the MEMS substrate 3 that will be described later serves as the bonding surface 12 of the CMOS substrate 4. Accordingly, the region surrounding the integrated circuit 11 at the center forms the bonding surface 12 of the CMOS substrate 4. Note that an electrode pad (not shown) that brings the MEMS substrate 3 and the CMOS substrate 4 into conduction is formed on the bonding projection part 31 (bonding surface 41) of the MEMS substrate 2. That is, with the bonding material M made of a conductive material, the equalization of the potentials between both the substrates 3 and 4 and the circuit connection (electric connection) between the integrated circuit 11 and the MEMS element 2 are performed via the electrode pad.

The MEMS substrate 3 is a silicon substrate made of silicon (Si), and the MEMS element 2 is formed on the MEMS substrate 3 according to a MEMS technology. The MEMS substrate 3 has a substrate main body 21 whose front surface serves as a mounting surface 21a of the MEMS element 2 and a bonding section 22 disposed over the substrate main body 21. That is, in the MEMS substrate 3, the bonding section 22 having the bonding surface 12 is disposed so as to surround the MEMS element 2 arranged at the center. Consequently, the MEMS substrate 3 is configured to be recessed at the center thereof as a whole.

Figure 3:
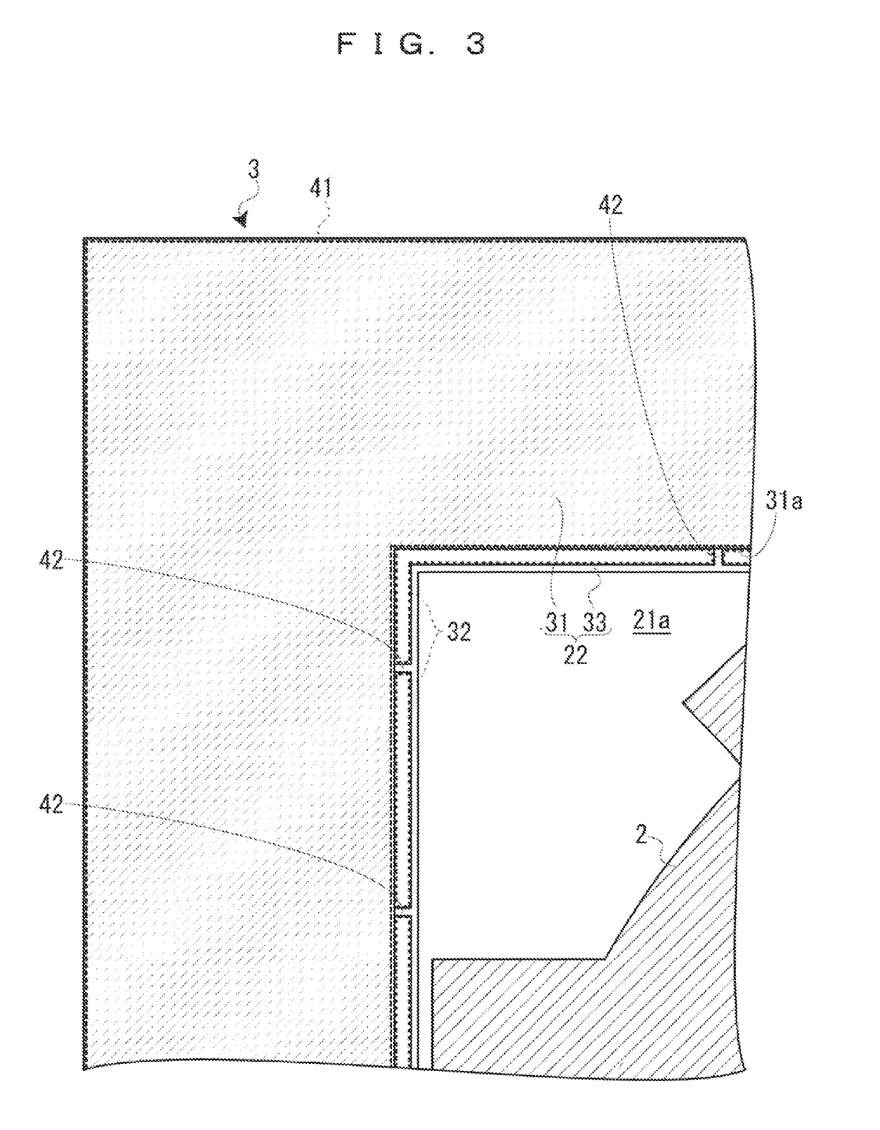
FIG. 3 is an enlarged plan view showing the vicinity of a bonding section.

As shown in FIG. 2 and FIG. 3, the bonding section 22 is formed to have the bonding projection part 31, which is provided to erect over the substrate main body 21 and formed in a square ring in a plan view (flat square), and have a gap formation part (wall body) 33, which is disposed between the bonding projection part 31 and the MEMS element 2 and forms reception gaps 32 (reception space) for the bonding material M between the gap formation part 33 and a side surface 31a of the bonding projection part 31, so as to surround the MEMS element 2. The reception gaps 32 are structured to receive the bonding material M extruded from between the bonding surfaces 12 and 41 and prevent the bonding material M from contacting the MEMS element 2 and the peripheral circuits thereof.

The bonding projection part 31 is disposed over the substrate main body 21 via an insulation layer 34 and provided to project from the substrate main body 21 to the side of the CMOS substrate 4 (opposite surface side). That is, the thickness of the bonding projection part 31 constitutes the hollow section 5 that accommodates the MEMS element 2. Further, the upper surface (the end surface on the side of the CMOS substrate 4 in the thickness direction of the substrate) of the bonding projection part 31 serves as the bonding surface 41 (sealing surface) of the MEMS substrate 3. Both the substrates 3 and 4 are eutectically bonded together in a state in which the bonding surface 41 of the bonding projection part 31 and the front surface (bonding surface 12) of the CMOS substrate 4 face each other via the bonding material M. Thus, both the substrates 3 and 4 are vacuum-sealed.

The gap formation part 33 is made of a thin wall body. Between the wall surface of the gap formation part 33 and the side surface 31a of the bonding projection part 31, the reception gaps 32 capable of receiving the bonding material M extruded from between the bonding surfaces 12 and 41 of both the substrates 3 and 4 to the side of the MEMS element 2 are formed. The gap formation part 33 extends along the side surface 31a of the bonding projection part 31 and is formed in a flat square as a whole. In addition, the gap formation part 33 is formed to be lower in height than the bonding projection part 31 and formed to be the same in height as the MEMS element 2. Accordingly, the upper surface (the end surface in the thickness direction of the substrate) of the gap formation part 33 is formed to be lower in height than the bonding surface 41.

Moreover, in a state of being separated from the mounting surface 21a of the MEMS element 2, the gap formation part 33 is supported by a plurality of support pieces 42 extending from the bonding projection part 31. That is, the gap formation part 33 is supported in a state of being floated from the mounting surface 21a by 2 μm. The plurality of support pieces 42 is formed in the extending direction of the gap formation part 33 at a pitch of 120 μm and is the same in height (size in the thickness direction of the substrate) as the gap formation part 33. Accordingly, the gap formation part 33 is joined to the side surface 31a of the bonding projection part 31 in the entire height direction thereof by the plurality of support pieces 42. In addition, due to the conductivity of the plurality of support pieces 42, the bonding projection part 31 and the gap formation part 33 have the same potential. Note that the gap formation part 33 and the plurality of support pieces 42 are integrally formed with each other by an etching process. Further, the separation process (elimination of the sacrifice layer) of the gap formation part 33 is preferably performed with the separation process of the movable part of the MEMS element 2.

The reception gaps 32 are formed to have a width by which a capillary phenomenon occurs in the bonding material M. Specifically, the reception gaps 32 are formed to have a width of 10 μm and thus have capacity enough to receive the bonding material M extruded from between the bonding surfaces 12 and 41. In addition, the reception gaps 32 are divided (partitioned) by the plurality of support pieces 42 in the extending direction of the bonding projection part 31 and the gap formation part 33 at a pitch of 120 μm. Note that the dividing pitch may be adjusted instead of the width of the reception gaps 32 in order to make a capillary phenomenon occur in the bonding material M at the reception gaps 32.

Here, with reference to FIGS. 4A to 4E, a description will be given of a manufacturing method for electronic devices 1. The manufacturing method is based on a wafer-level packaging technology in which substrate wafers are bonded together and then separated (divided) into the respective electronic devices 1.

Figure 4A:
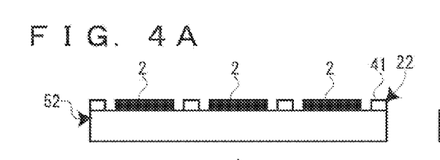
FIGS. 4A to 4E are explanatory views showing a manufacturing method for the electronic device.
Figure 4B:
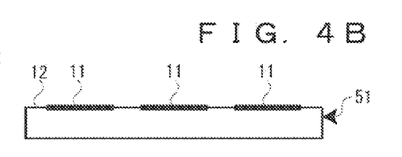

First, a CMOS substrate wafer 51 is prepared in which multiple integrated circuits 11 are formed on a silicon substrate (FIG. 4A). While, a MEMS substrate wafer 52 is prepared in which multiple MEMS elements 2 and a bonding section 22 are formed on a silicon substrate (FIG. 4B). The CMOS substrate wafer 51 is to be divided into CMOS substrates 4, and the MEMS substrate wafer 52 is to be divided into MEMS substrates 3.

Figure 4C:
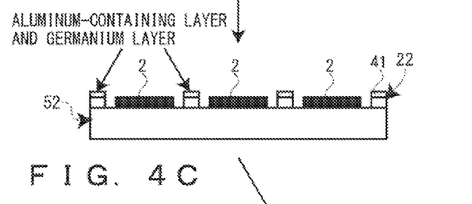
Figure 4D:
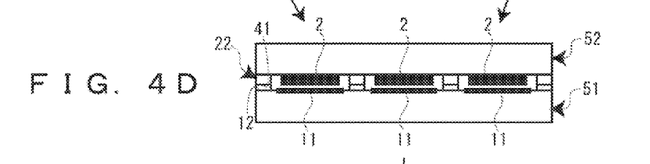

Next, an aluminum-containing layer and a germanium layer each forming a bonding material M are deposited on a bonding surface 41 of the MEMS substrate wafer 52 (FIG. 4C). Then, the MEMS substrate wafer 52 is eutectically bonded to the CMOS substrate wafer 51 so as to face the same. That is, the MEMS substrate wafer 52 is turned upside down, and the bonding surface 41 of the MEMS substrate wafer 52 is butted against a bonding surface 12 of the CMOS substrate wafer 51. Next, both the wafers 51 and 52 are heated under vacuum environment, and the MEMS substrate wafer 52 is pressed. Thus, the deposited germanium layer and the aluminum-containing layer are brought into a eutectic reaction at the boundary surface therebetween, whereby an aluminum-germanium alloy (eutectic alloy) is generated and both the substrate wafers 51 and 52 are eutectically bonded together (FIG. 4D).

At this time, the melted and fluidized bonding material M (eutectic alloy) may be extruded from between the bonding surfaces 12 and 41, but the extruded bonding material M is received by reception gaps 32. Specifically, as shown in FIGS. 5A to 5E, the extruded bonding material M is, when coming close to the reception gaps 32, (upwardly) absorbed by and flowed into the reception gaps 32 under a capillary phenomenon (the interface of the bonding material M rises) and remains there.

Figure 4E:
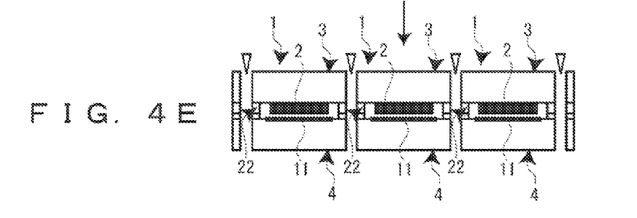
Figure 5A:
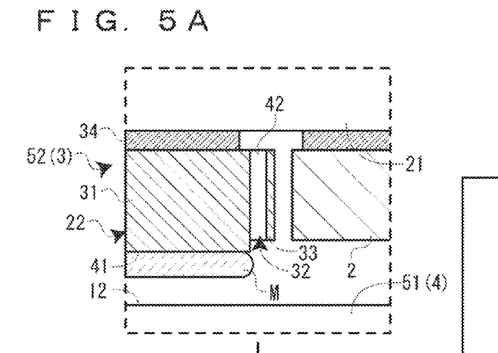
FIGS. 5A to 5E are views showing the movement of a bonding material extruded from between bonding surfaces.
Figure 5B:
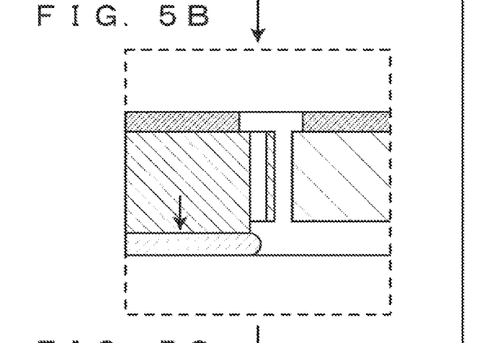
Figure 5C:
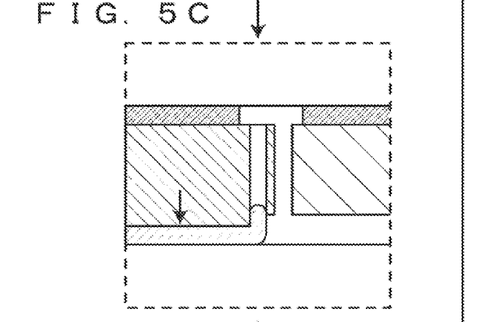
Figure 5D:
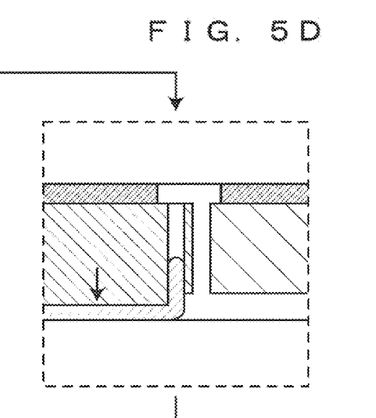
Figure 5E:
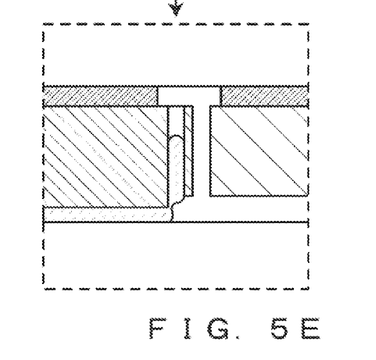

After both the substrates 3 and 4 are bonded together, the bonded MEMS substrate wafer 52 and the CMOS substrate wafer 51 are diced to be divided into the segments of the electronic devices 1 (segments of the chips) (FIG. 4E). Thus, the plurality of electronic devices 1 is manufactured.

According to the above configuration, the reception gaps 32 are formed between the gap formation part 33 and the side surface 31a of the bonding projection part 31, whereby the bonding material M extruded from between the bonding surfaces 12 and 41 is flowed into and received by the reception gaps 32. Accordingly, the bonding material M is prevented from being flowed into the side of the MEMS element 2. Therefore, the bonding material M can be prevented from contacting the MEMS element 2 and the peripheral circuits thereof without narrowing the arrangement areas of the MEMS element 2 and the peripheral circuits thereof. In other words, the arrangement areas of the MEMS element 2 and the peripheral circuits thereof can be enlarged. In addition, since the gap formation part 33 is supported by the bonding projection part 31, the gap formation part 33 is not required to stand up for itself and not required to have a thickness (rigidity) to stand up for itself. That is, since the gap formation part 33 can be made thin to a greater extent, the arrangement areas of the MEMS element 2 and the peripheral circuits thereof can be further enlarged. Moreover, since the gap formation part 33 is supported by the conductive support pieces 42 extending from the bonding projection part 31, the bonding projection part 31 and the gap formation part 33 can have the same potential.

Further, since the gap formation part 33 is separated from the mounting surface 21a of the MEMS element 2 (the substrate main body 21 of the MEMS substrate 3), an air hole is made at a part at which the gap formation part 33 is separated from the mounting surface 21a and thus internal atmosphere is released from the separated part when the bonding material M is flowed. Consequently, the bonding material M can be effectively (smoothly) flowed into the reception gaps 32.

Furthermore, since the reception gaps 32 are formed to have a width by which a capillary phenomenon occurs in the bonding material M, the capillary phenomenon occurs at the reception gaps 32. Therefore, the bonding material M is smoothly flowed into (absorbed by) the reception gaps 32 and remains there. Furthermore, the bonding material M can be absorbed by the reception gaps 32 regardless of how the MEMS substrate 3 and the CMOS substrate 4 are placed at the bonding. Thus, the bonding material M extruded from the bonding surface 41 can be efficiently received and reliably prevented from contacting the MEMS element 2 and the peripheral circuits thereof.

Furthermore, since a eutectic alloy is used as the bonding material M having fluidity, both the substrates 3 and 4 can be bonded together in a sealed state (vacuum-sealed). In addition, since the eutectic alloy contains aluminum as one constituent thereof, bonding of both the substrates 3 and 4 and the circuit connection between both the substrates 3 and 4 can be simultaneously performed, which enables the manufacturing of the electronic device 1 to be made easier.

Figure 6:
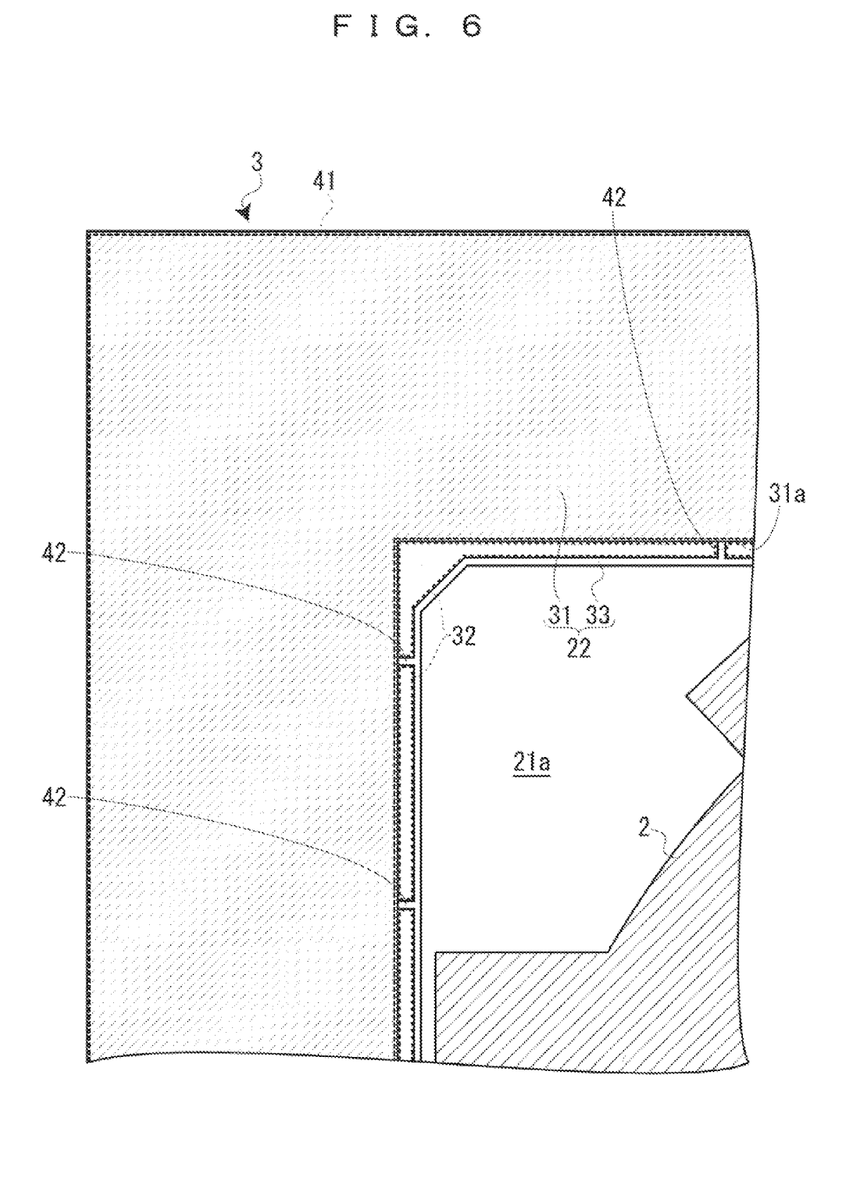
FIG. 6 is an enlarged plan view showing a modified example of the bonding section.

Note that in the embodiment, the reception gaps 32 are configured to have the same width over the entire area thereof in the extending direction of the bonding projection part 31 and the gap formation part 33. However, as shown in FIG. 6, the reception gaps 32 corresponding to the respective corner parts (corners) of the bonding projection part 31 may be configured to have a wider width than the reception gaps 32 at the other parts thereof. According to the configuration, the bonding material M can be suitably received at the respective corner parts as well. In this case, the reception gaps 32 corresponding to all the corner parts may be formed to have a wider width than the reception gaps 32 at the other parts, or the reception gaps 32 corresponding to some of all the corner parts may be formed to have a wider width than the reception gaps 32 at the other parts.

In addition, the present invention is applied to the bonding section 22 that surrounds the MEMS element 2, i.e., the bonding section 22 that functions as a sealing section. However, the present invention may be applied to the bonding section 22 that does not function as a sealing section.

Moreover, in the embodiment, the gap formation part 33 is configured to be entirely separated from the mounting surface 21a of the MEMS element 2. However, only some of the gap formation part 33 may be configured to be separated from the mounting surface 21a of the MEMS element 2. For example, the gap formation part 33 may be configured to be separated from the mounting surface 21a only at the intermediate part thereof in the extending direction or may be configured to be separated from the mounting surface 21a only at the end thereof in the extending direction.

Further, in the embodiment, the MEMS substrate 3 is configured to have the bonding section 22. However, the CMOS substrate 4 may be configured to have the bonding section 22 instead. Furthermore, both the MEMS substrate 3 and the CMOS substrate 4 may be configured to have the bonding section 22.

Figure 7:
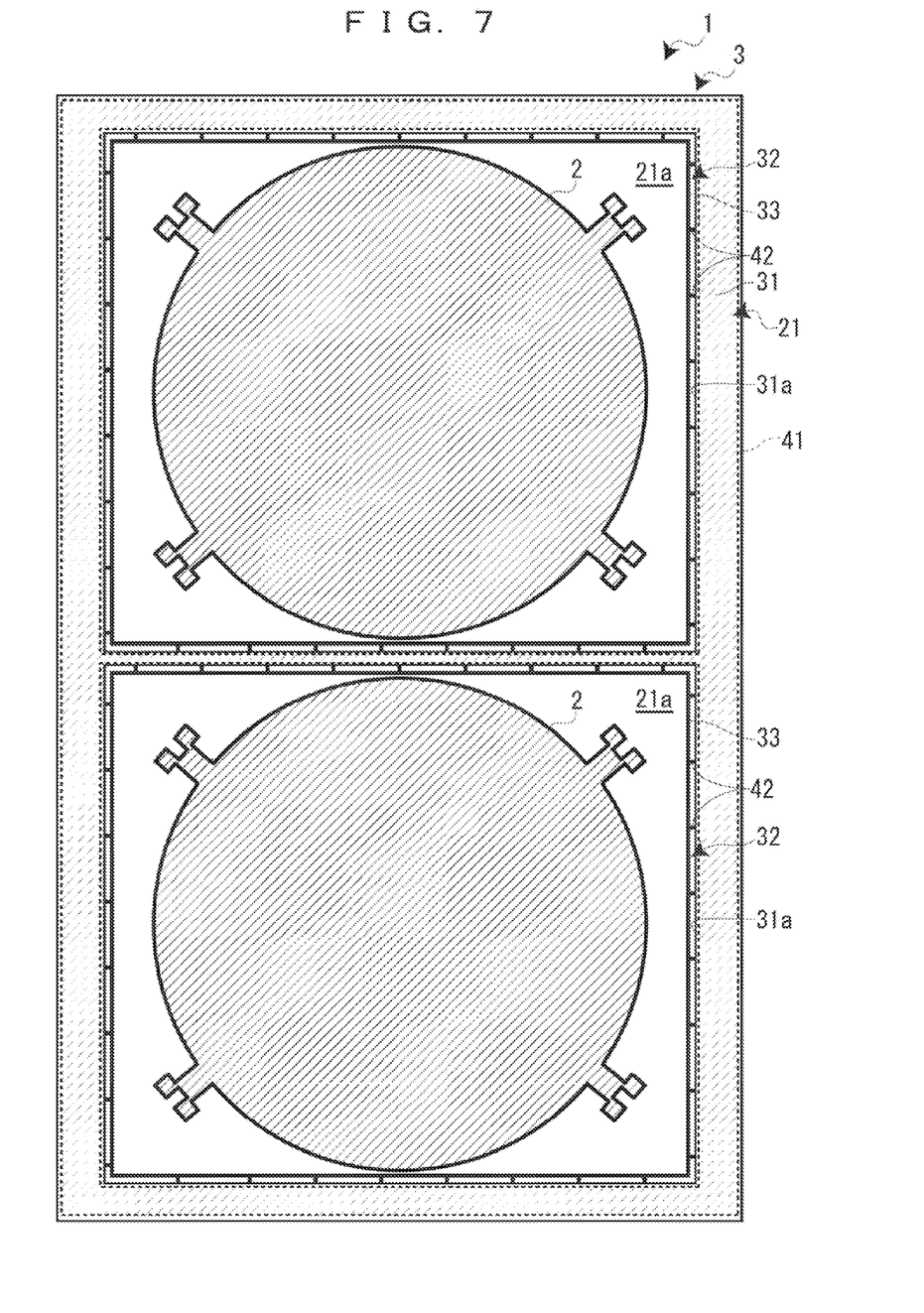
FIG. 7 is a plan view showing a modified example of the electronic device.

Furthermore, in the embodiment, the present invention is applied to the electronic device 1 on which the single MEMS element 2 is mounted. However, as shown in FIG. 7, the present invention may be applied to the electronic device 1 on which the two MEMS elements 2 are mounted. In this case, as shown in FIG. 7, the bonding projection part 31 located between the two MEMS elements 2 has the gap formation parts 33 at the side surfaces 31a on both sides thereof.

Furthermore, in the embodiment, the present invention is applied to the electronic device 1 on which the MEMS element 2 is mounted as a functional element. However, the present invention may be applied to the electronic device 1 on which a semiconductor element is mounted as a functional element.

Furthermore, in the embodiment, the second substrate bonded to the MEMS substrate 3 is the CMOS substrate 4. However, the second substrate bonded to the MEMS substrate 3 may be a bipolar substrate or a Bi-CMOS substrate on which both a bipolar and a CMOS are mounted. Furthermore, the second substrate may be a substrate on which the integrated circuit 11 is not mounted.

REFERENCE NUMERALS

1: electronic device
2: MEMS element
3: MEMS substrate
4: CMOS substrate
11: integrated circuit
12: bonding surface
21: substrate main body
31: bonding projection part
32: reception gap
33: gap formation part
41: bonding surface
42: support piece
M: bonding material

What is claimed is:

1. An electronic device obtained in such a way that a first substrate having a functional element mounted thereon and a second substrate are bonded together at bonding surfaces thereof with a bonding material having fluidity, wherein
at least one of the first substrate and the second substrate has
a bonding projection part provided to project from a substrate main body to an opposite surface side thereof and having the bonding surface and
a wall body disposed between the bonding projection part and the functional element and separated from the substrate main body at least at a part thereof, and
the wall body is supported by the bonding projection part via support pieces extending from the bonding projection part and forms reception gaps, which are capable of receiving the bonding material extruded from the bonding surface to a side of the functional element, between a wall surface thereof and the bonding projection part.

2. The electronic device according to claim 1, wherein the reception gaps are formed to have a width by which a capillary phenomenon occurs in the bonding material.

3. The electronic device according to claim 1, wherein the bonding projection part is formed in a flat square so as to surround the functional element, and
the reception gap corresponding to at least one corner part of the bonding projection part is formed to have a wider width than the reception gaps at the other parts thereof.

4. The electronic device according to claim 1, wherein the bonding material is a eutectic alloy.

5. The electronic device according to claim 1, wherein the second substrate has mounted thereon an integrated circuit that controls the functional element.

* * * * *